(12) United States Patent
Muchherla et al.

(10) Patent No.: US 11,853,205 B2
(45) Date of Patent: *Dec. 26, 2023

(54) MEMORY DEVICE WITH DYNAMIC CACHE MANAGEMENT

(71) Applicant: Micron Technology, Inc., Boise, ID (US)

(72) Inventors: Kishore Kumar Muchherla, Fremont, CA (US); Peter Feeley, Boise, ID (US); Ashutosh Malshe, Fremont, CA (US); Daniel J. Hubbard, Boise, ID (US); Christopher S. Hale, Boise, ID (US); Kevin R. Brandt, Boise, ID (US); Sampath K. Ratnam, Boise, ID (US); Yun Li, Fremont, CA (US); Marc S. Hamilton, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/172,205

(22) Filed: Feb. 21, 2023

(65) Prior Publication Data

US 2023/0195615 A1   Jun. 22, 2023

Related U.S. Application Data

(63) Continuation of application No. 17/374,906, filed on Jul. 13, 2021, now Pat. No. 11,593,261, which is a
(Continued)

(51) Int. Cl.
*G06F 3/00* (2006.01)
*G06F 12/02* (2006.01)
(Continued)

(52) U.S. Cl.
CPC .......... *G06F 12/0253* (2013.01); *G06F 3/064* (2013.01); *G06F 3/0629* (2013.01);
(Continued)

(58) Field of Classification Search
None
See application file for complete search history.

(56) References Cited

U.S. PATENT DOCUMENTS 8,595,415 B2   11/2013   Van Aken et al.
8,886,990 B2   11/2014   Meir et al.
(Continued)

FOREIGN PATENT DOCUMENTS

EP   2565792 B1   2/2015

OTHER PUBLICATIONS

EP Patent Application No. 18850118.3—Extended European Search Report, dated May 10, 2021, 7 pages.
(Continued)

*Primary Examiner* — Midys Rojas
(74) *Attorney, Agent, or Firm* — Perkins Coie LLP

(57) ABSTRACT

A memory system includes a memory array having a plurality of memory cells; and a controller coupled to the memory array, the controller configured to: designate a storage mode for a target set of memory cells based on valid data in a source block, wherein the target set of memory cells are configured with a capacity to store up to a maximum number of bits per cell, and the storage mode is for dynamically configuring the target set of memory cells in as cache memory that stores a number of bits less per cell than the corresponding maximum capacity.

20 Claims, 4 Drawing Sheets

Related U.S. Application Data continuation of application No. 16/697,724, filed on Nov. 27, 2019, now Pat. No. 11,093,385, which is a continuation of application No. 15/693,178, filed on Aug. 31, 2017, now Pat. No. 10,509,722.

(51) Int. Cl.
*G06F 12/0891* (2016.01)
*G06F 3/06* (2006.01)
*G06F 12/06* (2006.01)
*G06F 12/00* (2006.01)
*G11C 11/56* (2006.01)

(52) U.S. Cl.
CPC .......... *G06F 3/0634* (2013.01); *G06F 3/0688* (2013.01); *G06F 3/0689* (2013.01); *G06F 12/00* (2013.01); *G06F 12/0646* (2013.01); *G06F 12/0891* (2013.01); *G06F 2212/1044* (2013.01); *G06F 2212/2022* (2013.01); *G06F 2212/7205* (2013.01); *G11C 11/5621* (2013.01); *G11C 2211/5641* (2013.01)

(56) References Cited

U.S. PATENT DOCUMENTS

| | | |
|---|---|---|
| 10,509,722 B2 | 12/2019 | Muchherla et al. |
| 11,093,385 B2 | 8/2021 | Muchherla et al. |
| 2009/0327590 A1 | 12/2009 | Moshayedi |
| 2012/0240012 A1 | 9/2012 | Weathers et al. |
| 2013/0232296 A1 | 9/2013 | Yonezawa et al. |
| 2014/0059406 A1 | 2/2014 | Hyun et al. |
| 2014/0181432 A1 | 6/2014 | Horn |
| 2017/0109050 A1 | 4/2017 | Yao et al. |
| 2019/0065366 A1 | 2/2019 | Muchherla et al. |
| 2020/0042200 A1 | 2/2020 | Kanno |
| 2020/0097402 A1 | 3/2020 | Muchherla et al. |
| 2021/0342261 A1 | 11/2021 | Muchherla et al. |

OTHER PUBLICATIONS

International Application No. PCT/US2018/046816—International Search Report and Written Opinion, dated Dec. 13, 2018, 15 pages.
TW Patent Application No. 107129734—Taiwanese Office Action and Search Report, dated Aug. 28, 2019, with English Translation, 11 pages.
PRC (China) Patent Application No. 201880056006.7—Office Action and English Translation dated Mar. 23, 2023, 12 pages.

MEMORY DEVICE WITH DYNAMIC CACHE MANAGEMENT

CROSS-REFERENCE TO RELATED APPLICATIONS

This application is a continuation of U.S. patent application Ser. No. 17/374,906, filed Jul. 13, 2021, which is a continuation of U.S. patent application Ser. No. 16/697,724, filed Nov. 27, 2019, now U.S. Pat. No. 11,093,385; which is a continuation of U.S. patent application Ser. No. 15/693,178, filed Aug. 31, 2017, now U.S. Pat. No. 10,509,722; each of which is incorporated herein by reference in its entirety.

TECHNICAL FIELD

The disclosed embodiments relate to memory devices, and, in particular, to memory devices with a mechanism for dynamic management of cache memory functions.

BACKGROUND

Memory systems can employ memory devices to store and access information. The memory devices can include volatile memory devices, non-volatile memory devices, or a combination device. The non-volatile memory devices can include flash memory employing "NAND" technology or logic gates, "NOR" technology or logic gates, or a combination thereof.

Memory devices, such as flash memory, utilize electrical charges, along with corresponding threshold levels or processing voltage levels, to store and access data. In storing the data, the memory devices may have some storage portions that provide faster operating speeds and other storage portions that provide higher storage capacity and/or density. While attempts have been made to optimize memory devices to best exploit these different capabilities, various challenges (e.g., numerous different usage conditions, changes in performance characteristics of the flash memory devices caused by usage, etc.) have made it difficult to take full advantage of the different characteristics.

Thus, there is a need for a memory device with dynamic cache management. In view of the ever-increasing commercial competitive pressures, along with growing consumer expectations and the desire to differentiate products in the marketplace, it is increasingly desirable that answers to these problems be found. Additionally, the need to reduce costs, improve efficiencies and performance, and meet competitive pressures adds an even greater pressure to find these answers.

DETAILED DESCRIPTION

Figure 1:
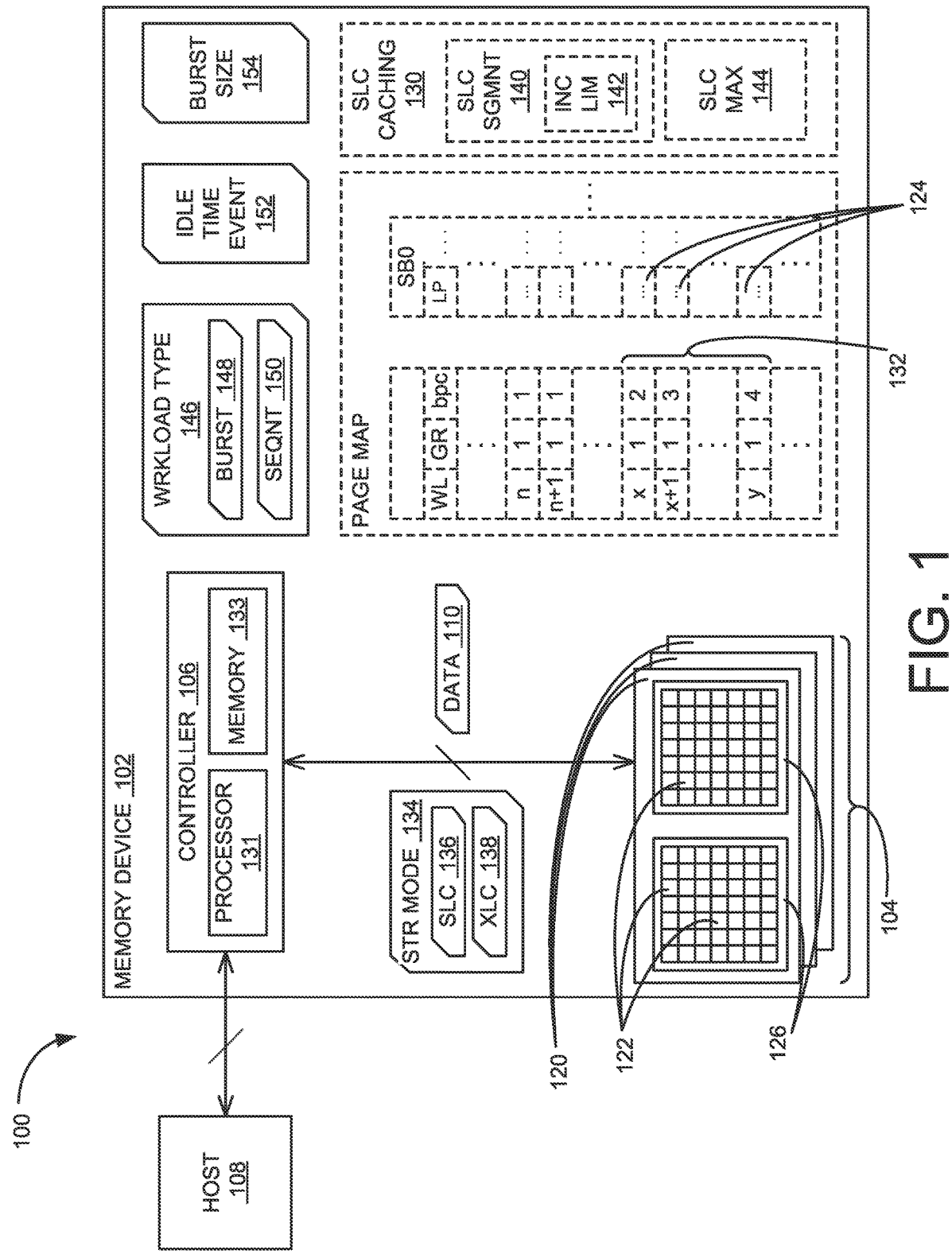
FIG. 1 is a block diagram of a memory system with dynamic cache management in accordance with an embodiment of the present technology.

The technology disclosed herein relates to memory devices, systems with memory devices, and related methods for dynamically managing cache memory for the memory devices. The memory systems can use valid data found in source blocks of garbage collection to determine or recognize a type or a pattern of work being processed by the memory systems and manage the caching function accordingly.

A memory device can include single-level cells (SLCs) for holding or representing one bit per cell (e.g., in one of two charge levels) and/or extra-level cells (XLCs) for holding or representing multiple bits per cell (e.g., in one of more than two charge levels) according to a type or a characteristic of the work being processed by the memory device. An SLC can be programmed to a targeted one of two different data states that can be represented by the binary units 1 or 0. An XLC can be programmed to a targeted one of more than two data states.

For example, an XLC can include a flash memory cell that can be programmed to any one of four states (e.g., represented by the binary 00, 01, 10, 11) to store two bits of data. Such XLCs are known as a multilevel cells (MLCs). Still other XLCs can include flash memory cells the can be programmed to any one of eight data states (e.g., 000, 001, 010, 011, 100, 101, 110, 111) to store three bits of data in a single cell. Such cells may be referred to as triple level cells (TLC). Even higher number of data states are possible for XLCs. For example, quad level cells (QLCs) can be programmed to any one of 16 data states (e.g., 0000, 0001, 0010, 0011, 0100, 0101, 0110, 0111, 1000, 1001, 1010, 1011, 1100, 1101, 1110, 1111) for storing four bits of data.

The memory cells capable of storing higher numbers of data states can provide higher density memories or bulk memory without increasing the number of memory cells, since each cell can represent more than one bit. While more information can be stored in a given number of cells when operating as XLCs, write performance may reduce due to slower programming times required for XLCs. For example, write performance may degrade in employing additional or detailed processes to write data according to tolerance windows that decrease by increasing the number of possible data states within a given range. As such, SLCs may be used as cache memory for NAND flash memory devices. The SLC cache can include static SLC cache defined by SLC reserved blocks or dynamic SLC cache defined by using XLC blocks in SLC mode.

The SLC cache can be generated or reclaimed during idle times, such as during a break or pause that occur while processing host data, so that the host data can be written in the SLC mode. However, idle times may occur less frequently for certain work conditions, which can lead to the memory devices failing to release sufficient amount of blocks for writes and thus failing to catch up with the host write sizes.

Conventionally, the memory devices pick new host blocks (i.e. memory blocks designated for upcoming or subsequent writes) from XLC block pools, and thus writing the subsequent host data in XLC mode, to increase the block sizes and slow down the block consumption rate. Consequently, the write performance would decrease in using the XLC mode in comparison to the SLC mode. Under steady state (i.e., work conditions with less frequent idle times, such as when a predetermined number of memory blocks or pages are filled before detection of an idle time event representing a pause in storing the data), operating the XLC memory blocks in SLC mode can reduce the effective size of the memory blocks, reducing the storage capacity. For example, for blocks capable of representing two bits, operating in the SLC mode would reduce the capacity by half. Also for example, operating TLC memory blocks in SLC mode would reduce the capacity to one-third original, and QLC blocks would be reduced to one-fourth, etc. Potential addresses that are lost due to the reduction in capacity, such as corresponding to the remaining unused half, two-thirds, or three-fourths in the examples above, may be forced into garbage collection (i.e., a process that erases stale or useless data and reclaims occupied memory blocks for reuse in storing new data) for certain types of workloads.

Instead, in several embodiments of the present technology, a memory device can track valid data in memory block subject to garbage collection to manage operating modes of memory blocks. The memory device can use the amount of valid data as an indication of write amplification (WA) associated with the work being performed by the memory device, where WA is representation of a size of the data intended to be written in the memory device 102 in comparison to an actual corresponding amount of information physically written in the memory device (e.g., due to rewrites associated with operations for evening the number of writes across cells, for reclaiming memory blocks, etc.). If the valid data is less than a threshold, the memory device can characterize the work as low WA and open the host blocks in SLC mode even under steady state, thereby improving the performance of the memory device.

Further, the term "dynamic" as used herein describes operations, functions, actions or implementation occurring during the operation, usage or deployment of a memory device. Dynamically occurring operations, functions, actions or implementation can occur after the design, manufacture, and initial testing, setup or configuration (e.g., in a user environment).

FIG. 1 is a block diagram of a memory system 100 with dynamic cache management in accordance with an embodiment of the present technology. The memory system 100 includes a memory device 102 having a memory array 104 (e.g., NAND flash) and a controller 106. The memory device 102 can operably couple the memory array 104 to a host device 108 (e.g., an upstream central processor (CPU)).

The memory array 104 can include circuitry configured to store data and provide access to data. The memory array 104 can be provided as semiconductor, integrated circuits and/or external removable devices in computers or other electronic devices. The memory array 104 includes a plurality of memory regions, or memory units 120. The memory units 120 can be individual memory dies, memory planes in a single memory die, a stack of memory dies vertically connected with through-silicon vias (TSVs), or the like. In one embodiment, each of the memory units 120 can be formed from a semiconductor die and arranged with other memory unit dies in a single device package (not shown). In other embodiments, one or more of the memory units 120 can be co-located on a single die and/or distributed across multiple device packages. The memory device 102 and/or the individual memory units 120 can also include other circuit components (not shown), such as multiplexers, decoders, buffers, read/write drivers, address registers, data out/data in registers, etc., for accessing and/or programming (e.g., writing) the data and other functionality, such as for processing information and/or communicating with the controller 106.

Each of the memory units 120 includes an array of memory cells 122 that each store data in a charge storage structure. The memory cells 122 can include, for example, floating gate, charge trap, phase change, ferroelectric, magnetoresistive, and/or other suitable storage elements configured to store data persistently or semi-persistently. The memory cells 122 can be one-transistor memory cells that can be can be programmed to a target state to represent information. For instance, electric charge can be placed on, or removed from, the charge storage structure (e.g., the charge trap or the floating gate) of the memory cell 122 to program the cell to a particular data state.

The stored charge on the charge storage structure of the memory cell 122 can indicate a threshold voltage (Vt) of the cell. The threshold voltage can correspond to the different data states allowable for the corresponding memory cell 122. For example, SLCs can be programmed to a targeted one of two different data states, which can be represented by the binary units 1 or 0. Similarly, the threshold voltage can correspond to four data states for MLCs, eight data states for TLCs, 16 data states for QLCs, etc.

The memory cells 122 can be arranged in rows (e.g., each corresponding to a word line) and columns (e.g., each corresponding to a bit line). Each word line can include one or more memory pages 124, depending upon the number of data states the memory cells 122 of that word line are configured to store.

For example, the memory cells 122 of a single word line (i.e., including a single memory page 124) can each store one of two data states (e.g., SLC memory cells configured to store one bit each). Alternatively, the memory cells 122 of a single word line (i.e., including two memory pages 124) can each store one of four data states (e.g., MLC memory cells configured to store two bits each) and include two memory pages 124. Moreover, within the word line, pages 124 can be interleaved so that the memory cells 122 of the word line configured to store one of two data states (e.g., SLC memory cells) can include two pages, in an "even-odd bit line architecture" (e.g., where all the memory cells 122 in odd-numbered columns of a single word line are grouped as a first page, and all the memory cells 122 in even-numbered columns of the same word line are grouped as a second page). When even-odd bit line architecture is utilized in organizing word lines having the memory cells 122 that are each configured to store larger numbers of data states (e.g., memory cells configured as MLC, TLC, QLC, etc.), the number of pages per word line can be even higher (e.g., 4, 6, 8, etc.).

Each column can include a string of series-coupled memory cells 122 coupled to a common source. The memory cells 122 of each string can be connected in series between a source select transistor (e.g., a field-effect transistor) and a drain select transistor (e.g., a field-effect transistor). Source select transistors can be commonly coupled to a source select line, and drain select transistors can be commonly coupled to a drain select line.

The memory device 102 can perform data operations using different groupings of the memory cells 122. For example, the memory pages 124 of the memory cells 122 can be grouped into memory blocks 126. In operation, the data can be written or otherwise programmed (e.g., erased) with regards to the various memory regions of the memory device 102, such as by writing to groups of pages 124 and/or memory blocks 126. In NAND-based memory, a write operation often includes programming the memory cells 122 in selected memory pages 124 with specific data values (e.g., a string of data bits having a value of either logic 0 or logic 1). An erase operation is similar to a write operation, except that the erase operation re-programs an entire memory block 126 or multiple memory blocks 126 to the same data state (e.g., logic 0).

In other embodiments, the memory cells 122 can be arranged in different types of groups and/or hierarchies than those shown in the illustrated embodiments. Further, while shown in the illustrated embodiments with a certain number of memory cells, rows, columns, blocks, and memory units for purposes of illustration, in other embodiments, the number of memory cells, rows, columns, blocks, and memory units can vary, and can be larger or smaller in scale than shown in the illustrated examples.

For example, in some embodiments, the memory device 100 can include only one memory unit 120. Alternatively, the memory device 100 can include two, three, four, eight, ten, or more (e.g., 16, 32, 64, or more) memory units 120. While the memory units 120 are shown in FIG. 1 as including two memory blocks 126 each, in other embodiments, each memory unit 120 can include one, three, four eight, or more (e.g., 16, 32, 64, 100, 128, 256 or more memory blocks). In some embodiments, each memory block 126 can include, e.g., $2^{15}$ memory pages, and each memory page within a block can include, e.g., $2^{12}$ memory cells 122 (e.g., a "4 k" page).

The controller 106 can be a microcontroller, special purpose logic circuitry (e.g., a field programmable gate array (FPGA), an application specific integrated circuit (ASIC), etc.), or other suitable processor. The controller 106 can include a processor 131 configured to execute instructions stored in memory. In the illustrated example, the memory of the controller 106 includes an embedded memory 133 configured to perform various processes, operations, logic flows, and routines for controlling operation of the memory system 100, including managing the memory device 102 and handling communications between the memory device 102 and the host device 108. In some embodiments, the embedded memory 133 can include memory registers storing, e.g., memory pointers, fetched data, etc. The embedded memory 133 can also include read-only memory (ROM) for storing micro-code. While the exemplary memory device 102 illustrated in FIG. 1 has been illustrated as including the controller 106, in another embodiment of the present technology, a memory device may not include a controller, and may instead rely upon external control (e.g., provided by an external host, or by a processor or controller separate from the memory device).

The memory system 100 can implement dynamic SLC caching 130 for operating on data 110 with the memory array 104 (e.g., reading, writing, erasing, etc.). For the dynamic SLC caching 130, the memory system 100 can temporarily store data (e.g., most active data) on XLC units 132 configured in SLC mode to improve access or read times, write times, or a combination thereof. The XLC units 132 are memory cells capable of storing more than one bit of data. For example, the XLC units 132 can include MLCs, TLCs, QLCs, or any other memory cells capable of holding more than one bit per cell.

In FIG. 1, the XLC units 132 are illustrated using a page map. The page map can represent groupings of the memory cells 122, addresses, types, or a combination thereof for the memory pages 124 for each of the memory blocks 126. The page map can identify logical page types, such as lower, upper, or extra page, and also word-line and word-line group associated with each of the pages. The page map can further include bits-per-cell (illustrated as 'bpc') corresponding to the bit-holding capacity of each cell (e.g., SLCs corresponds to bpc value of one and XLCs correspond to bpc values greater than one).

The memory system 100 can determine a storage mode 134 for controlling the storage capacity and processing time of the XLC units 132. The storage mode 134 can be represented by a signal or parameter indicating a storage capacity of the corresponding XLC units 132. The storage mode 134 can indicate that the XLC units 132 are used to store either a number of bits less than their corresponding full capacity, or a number of bits corresponding to their full capacity.

For example, the memory system 100 can designate the storage mode 134 as SLC mode 136 or XLC mode 138. The SLC mode 136 can include the signal or parameter used to indicate that the corresponding XLC units 132 are used to store one bit per cell. In other words, the memory system 100 can use the SLC mode 136 to have the XLC units 132 operate as though they were SLC units. In contrast, the memory system 100 can use the XLC mode 138 to have the XLC units 132 operate at their full capacity (e.g. storing two bits per cell for MLC units, three bits per cell for TLC units, four bits per cell for QLC units, etc.).

For illustrative purposes, the XLC mode 138 is described below as indicating that the corresponding memory cells 122 are used to store a number of bits per cell corresponding to their full capacity. However, it is understood that the memory system 100 can utilize different subsets of control signals or parameters to designate storage modes in which multiple bits per cell are used, but at less than the full capacity of the corresponding memory cells 122 (e.g., using TLC cells in MLC mode, etc.).

Using the SLC mode 136, the memory system 100 can improve the write performance while reducing the storage density of the XLC units 132. Alternatively, using the XLC mode 138 can reduce the write performance while increasing the storage density of the XLC units. When the memory blocks 126 are operated in the XLC mode 138, the full range of logical block addresses (LBA) can be accommodated on the memory array 104. In contrast, utilizing MLC, TLC or QLC blocks in the SLC mode 136 can reduce the accessible LBA range for those blocks by factor of 2, 3 or 4, respectively.

While the full LBA range may be available in XLC mode, writing with the full storage capacity (e.g., at the maximum number of supported bits per cell) can be slower than writing one bit per cell for various reasons. For example, operating the XLC units 132 in the SLC mode 136 can allow larger margins for read thresholds and fewer iterations for incremental step pulse programming (ISPP) used to write the target data. To write data according to ISPP, the memory device 102 can store charge on the charge storage structure of a memory cell via incremental programming. To program the memory cell to a desired target state, a series of incremental charges can be applied at multiple times to increase the charge stored on the cell's charge storage structure. After each programming step, the charge stored on the charge storage structure can be verified to determine whether it has reached the desired target state. By operating in the SLC mode, the memory system 100 can use larger amounts of charge for each increment such that less iterations are needed to reach the desired level.

For certain workload types 146 (i.e., categorizations for operations handled by the memory device 102), improvement of the write performance can lead to an overall gain without experiencing much negative impact from the reduction in the storage density. During the dynamic SLC caching 130, the SLC cache (e.g., the XLC units 132 operating in SLC mode 136) can be generated or reclaimed during idle times. However, some categories of work can be without the idle times or include relatively infrequent idle times, such as continuous workload 150 (i.e., steady state), which leads to expenditure or usage of all available SLC cache. The memory system 100 can open the XLC units 132 in SLC mode 136 (i.e., instead of the conventional approach of opening them in the XLC mode 138) based on estimating or recognizing an amount of WA associated with the work being performed by the memory device 102.

Figures 2A, 2B, 2C:
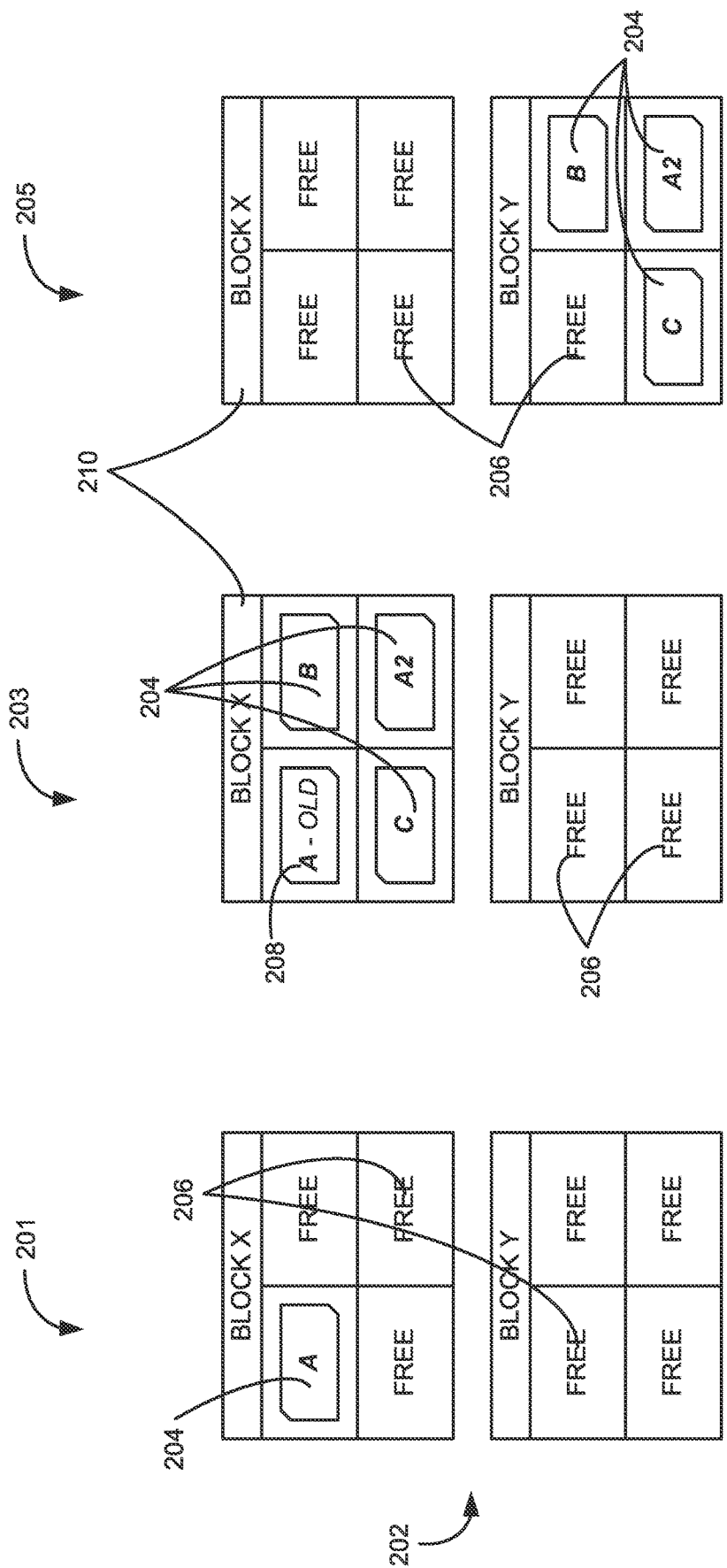
FIGS. 2A, 2B and 2C illustrate a garbage collection function in accordance with an embodiment of the present technology.

FIGS. 2A, 2B and 2C illustrate a progression for a garbage collection (GC) function 202 in accordance with an embodiment of the present technology. The GC function 202 finds old or stale data for erasure in reclaiming the memory block 126 of FIG. 1 for reuse in storing new data. Through the GC function 202, valid data 204 from one or more pages can be collected and written to a new empty page and the old page can be invalidated, erased, and reclaimed for reuse and subsequent storage of new incoming data. The valid data 204 is a correct or up-to-date instance of the data 110 of FIG. 1 stored in the memory cells 122 of FIG. 1 intended for later access. When previous data is updated, flash memory devices write the new data (i.e., the valid data 204) to a different location, with the old data becoming stale or unnecessary, instead of directly overwriting the old data with the new data. The GC function 202 can remove such stale or unnecessary data while retaining the valid data 204 at a new location. Since flash memory devices write in increments of the memory pages 124 of FIG. 1 and erase in increments of the memory blocks 126, the garbage collection function 202 can move pages of data and free up memory blocks for erase operations.

FIGS. 2A, 2B and 2C conceptually illustrate a sequence of states associated with the data 110 stored in the memory array 104 of FIG. 1 (such as in the memory pages 124 within the memory blocks 126 labeled 'Block X' and 'Block Y) at times 201, 203, and 205 during the GC function 202. FIG. 2A illustrates an initial state or a starting point of the state of the data 110 stored in 'Block X' at time 201. FIG. 2B illustrates a changed state or an update to the state of the data 110 stored in 'Block X' at later time 203. FIG. 2C illustrates the GC function 202 moving valid data 204 from 'Block X' to 'Block Y' at time 205.

For example, in FIG. 2A, 'Block X' can store or include the valid data 204 labeled 'A.' Other available instances of the memory pages 124 can each be associated with a write-available status 206 representing that the corresponding page is unoccupied and available for writes.

In FIG. 2B, the memory system 100 can store further data, labeled 'B' and 'C.' The memory system 100 can further store data 'A2' representing updated version of data 'A,' which results in 'A' becoming old and stale. The valid data 204 at time 203 can correspond to data labeled 'B', 'C', and 'A2.' The previously stored and the still existing data 'A' can represent expired data 208. The expired data 208 can include the data 110 previously stored but no longer useful, out-of-date, stale, or invalid due to one or more subsequent operations, changes, or updates.

In FIG. 2C, the memory system 100 can implement the GC function 202 to free up the memory cells 122 from a GC source block 210 (i.e., the memory block targeted for or subject of the garbage function 202 as represented by 'Block X' in FIGS. 2A, 2B, and 2C). The memory system 100 can identify the valid data 204 and the expired data 208 in the GC source block 210 for the GC function 202. As illustrated in FIG. 2C, the memory system 100 can copy the valid data 204, without the expired data 208, to a new location labeled 'Block Y'. The memory system 100 can subsequently erase the data 110 (i.e., the duplicated valid data 204 and the expired data 208) stored in the GC source block 210 (i.e., 'Block X'). As a result, the memory pages 124 of GC source block 210 can correspond to write-available status 206 representing availability for storing new incoming data.

Figure 3:
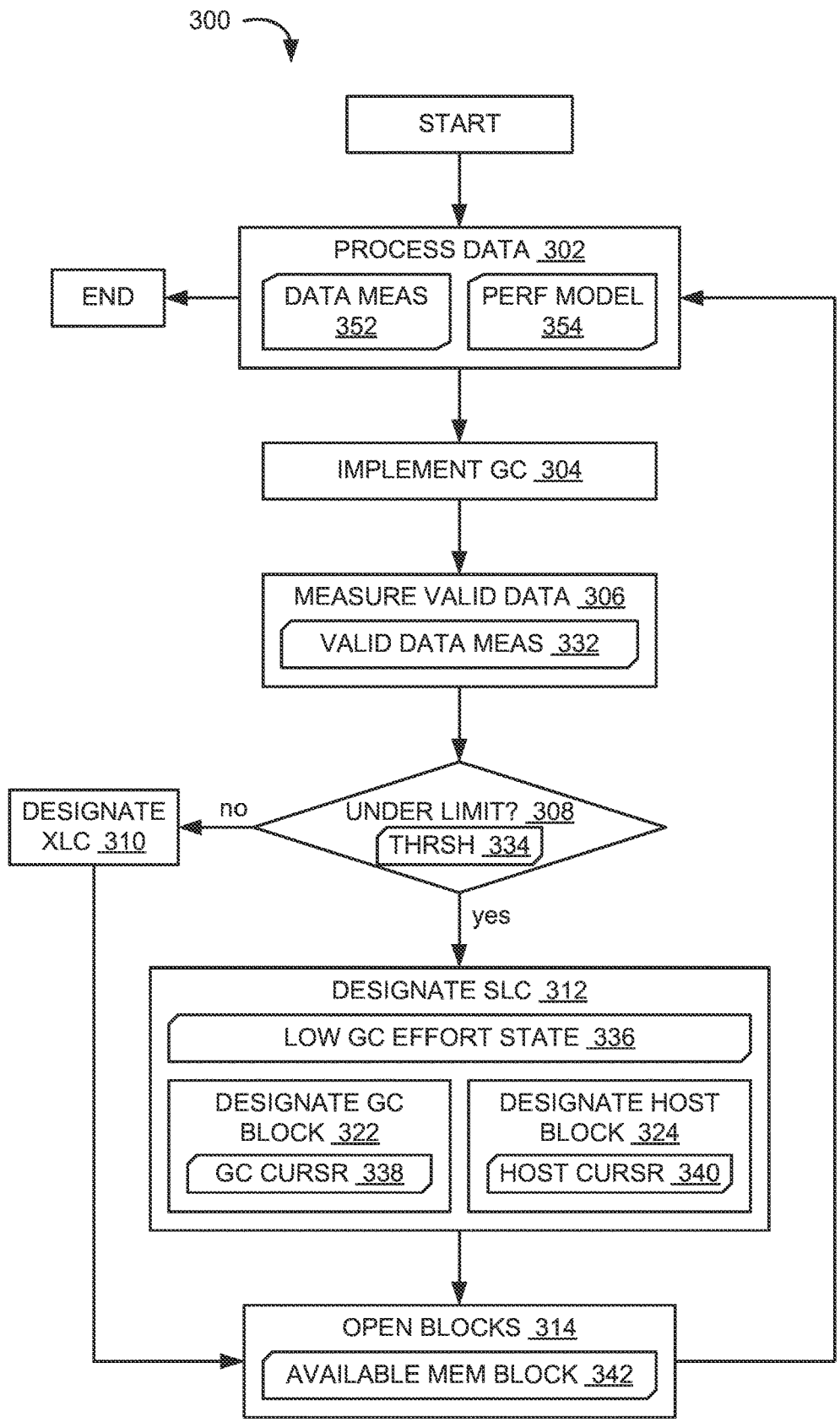
FIG. 3 illustrates an example method of operating the memory system in FIG. 1 in accordance with embodiments of the present technology.

FIG. 3 is a flow diagram illustrating an example method 300 of operating the memory system 100 of FIG. 1 in accordance with embodiments of the present technology. The method 300 can include implementation of the dynamic SLC caching 130 of FIG. 1 including management of the cache according to an amount of the valid data 204 of FIG. 2 in the GC source block 210 of FIG. 2 for the GC function 202 of FIG. 2.

At a box 302, the memory system 100 can perform operations on the data 110 of FIG. 1 with respect to the memory device 102 of FIG. 1, such as by writing the data 110, reading the data 110, erasing the data 110, etc. The memory system 100 can perform various different types of work under various different conditions (e.g., the continuous workload 150 of FIG. 1 representing steady state). While performing the work, the memory system 100 can designate the storage mode 134 of FIG. 1 to vary the utilization of the XLC units 132 of FIG. 1 according to the type of work, the condition, etc. For example, the memory system 100 can designate the XLC units 132, capable of holding multiple bits, to operate in the SLC mode 136 of FIG. 1 and store one bit per memory cell 122 of FIG. 1.

At a box 304, the memory system 100 can implement the GC function 202 of FIG. 2. The memory system 100 can implement the GC function 202 along with the data operation of represented in the box 302, such as by operating in parallel. The memory system 100 can trigger the GC function 202 whenever one or more memory blocks 126 of FIG. 1 become full, such as when all of the memory pages 124 of FIG. 1 within the corresponding blocks 126 have been written and none of the pages 124 therein have the write-available status 206 of FIG. 2.

The memory system 100 can implement the GC function 202 by selecting the GC source block 210 that will be targeted for the GC function 202. The memory system 100 can select the GC source block 210 as one of the memory blocks 126 that has become full.

After selecting the GC source block 210, the memory system 100 can identify the valid data 204 stored therein, copy the valid data 204 to a new page, and erase the GC source block 210. The memory system 100 can effectively move the valid data 204 and erase the GC source block 210 to delete the expired data 208 of FIG. 2, and thus free up the GC source block 210 for subsequent writes. By performing the GC function 202 on the blocks with the least amount of data, the memory system 100 can recover the memory pages 124 therein for the subsequent writes.

At a box 306, the memory system 100 can measure an amount of the valid data 204 stored in the GC source block 210. The memory system 100 can use the valid data 204 as a feedback mechanism in managing the SLC cache.

Whenever the GC function 202 is triggered, the memory system 100 can calculate a valid data measure 332 representing the amount of the valid data 204 stored within the GC source block 210 before erasure. The memory system 100 can calculate by counting the number of memory pages 124 storing the valid data 204 while ignoring any pages with write-available status 206 or the expired data 208, or by counting the valid pages in comparison to pages with the expired data 208 without empty or write-available pages.

The memory system 100 can further calculate the valid data measure 332 as a comparison (e.g., such as using a fraction or a percentage) between the amount of the valid data 204 and the size of the GC source block 210, the amount of empty or write-available pages, the amount of pages with expired data 208, or a combination thereof.

At a box 308, the memory system 100 can compare the valid data measure 332 with a decision threshold 334 representing a limit used to designate the storage mode 134 of an available memory block 342 (i.e., the memory cells 122 set or designated for subsequent or upcoming data writes). The decision threshold 334 can represent a threshold amount of the valid data 204 corresponding to the SLC mode 136 and the XLC mode 138 of FIG. 1. Accordingly, the memory system 100 can designate the storage mode 134 as either the SLC mode 136 or the XLC mode 138 based on the valid data measure 332.

The decision threshold 334 can further correspond to the WA and characterize a low WA state as determined for the memory system 100. For example, the decision threshold 334 can be a value between 0% and less than 25% of the GC source block 210. The decision threshold 334 can be predetermined for the memory system 100 or determined in real-time according to a predetermined method, function, operation, circuit, equation, etc.

At a box 310, the memory system 100 can designate the storage mode 134 for the available memory block 342 as the XLC mode 138 when the valid data measure 332 is not less than the decision threshold 334. For performing workloads with high WA, as characterized by the valid data measure 332 exceeding the decision threshold 334, the memory system 100 can designate the XLC mode 138 to increase the storage capacity and slow down the block consumption rate. Thus, the memory system 100 can use the valid data measure 332 and the decision threshold 334 to adapt to high WA states and utilize the XLC mode 138 accordingly.

At a box 312, the memory system 100 can designate the storage mode 134 for the available memory block 342 as the SLC mode 136 when the valid data measure 332 is less than the decision threshold 334. For performing workloads with low WA, as characterized by the valid data measure 332 being less than the decision threshold 334, the memory system 100 can designate the SLC mode 136 to increase the write performance and effectively provide burst speeds.

With the determination that the valid data measure 332 is less than the decision threshold 334, the memory system 100 can determine that the memory device 102 is operating in a low logic saturation state 336 (e.g., corresponding to a low garbage collection effort state) representing small (i.e. as defined by the decision threshold 334) amounts of the valid data relative to the advertised size of the memory device. The low logic saturation state 336 can be characteristic of the low WA state. It could also indicate that the memory device is operating at a super-hot host data that is immediately being over-written creating blocks with smaller amount of valid data. Accordingly, the memory system 100 can designate the available memory block 342 to operate in the SLC mode 136 for the upcoming or subsequent data writes.

For example, the memory system 100 can designate the SLC mode 136 for a block corresponding to a GC cursor 338 (i.e., an address for the memory block subject to the GC function 202, such as an address for the GC source block 210) as represented in box 322 or for a block corresponding to a host cursor 340 (i.e., an address for the memory block that is targeted to store incoming data or targeted for the next write operation) as represented in box 324. For box 322, the memory system 100 can designate the GC source block 210 to operate in the SLC mode 136 once it becomes released for data writes after the GC function 202. The GC source block 210 can become the available memory block 342 once it becomes released. For box 324, the memory system 100 can designate the available memory block 342 (i.e., the memory block that is currently designated for the next occurring memory write) to operate in the SLC mode 136 regardless of the GC source block 210.

At a box 314, the memory system 100 can open up memory blocks for write operations, including allowing writes to the available memory block 342. The memory system 100 can open up the memory blocks according to the storage mode 134 that was designated in box 310 or 312. Accordingly, the memory system 100 can continue operating on the data as represented with a feedback loop going from box 314 to box 302.

The memory system 100 can designate the available memory block 342 to operate in the SLC mode 136 even under steady-state or the continuous workload 150. The designation can occur whenever the GC function 202 is triggered and independent of the idle time. The memory system 100 can use the valid data measure 332 and the decision threshold 334 to intelligently adapt to the steady state workflow and provide SLC cache when WA is low, to provide increase in write performance without suffering from the increase in the block consumptions rate. Due to the low WA and small amounts of the valid data 204, the GC function 202 can recover the blocks at high speeds and sufficiently offset the block consumption rate. As such, the memory system 100 can designate the SLC mode 136 under steady state regardless of an amount of data previously written in the SLC mode 136.

Further, the memory system 100 can designate the SLC mode 136 under steady state regardless of a data desirability measure 352 (i.e., a popularity of a trace associated with the work being performed or how "hot" the trace is) associated with a performance model 354 (i.e., benchmark traces characterizing a pattern or type of the workload). Since the memory system 100 can designate the SLC mode 136 based on determining the low logic saturation state 336, the memory system 100 can designate the SLC mode 136 even for super-hot benchmark traces under steady state.

Designating the storage mode 134 according to the valid data measure 332 of the GC source block 210 under steady state provides the benefit of increasing the write performance even in the absence of idle time. By designating the SLC mode 136 under steady state, the memory device 102 can perform at burst speed without the idle time for super-hot data and for user patterns operating at lower logic saturation.

Further, opening the host and GC cursor blocks in the SLC mode 136 when the GC WA is low (i.e., as defined by the decision threshold 334) according to the valid data measure 332 of the GC source block 210 provides the benefit of regulating the number of program-erase cycles experienced by the XLC units 132. As such, P/E cycles of the flash memory can be tightly controlled through the use of the SLC mode 136 according to the valid data measure 332 of the GC source block 210.

The SLC caching 130 and/or the method 300 can be executed or implemented, for example, by a processing circuitry for the memory device 102 or the host device 108, such as the controller 106, the memory array 104, processor for the host device 108, a portion therein or a combination thereof. The SLC caching 130 and/or the method 300 can include or correspond to the configuration of the controller 106, the memory array 104, the host device 108, or a combination thereof. The SLC caching 130 can further include, one or more methods, operations, steps or instructions, information, or a combination thereof stored within or accessed using the controller 106, the memory array 104, the host device 108, or a combination thereof.

For illustrative purposes, the flow diagram has been described with a sequence and operations discussed as examples above. However, it is understood that the method 300 can be different. For example, operations represented in boxes 304 through 314 can be combined with operations represented in the box 302. Also for example, operations represented in boxes 304 and 306 can be combined. Also for example, operations represented in boxes 304 through 312 can run in parallel to those represented in boxes 302 and 314.

Figure 4:
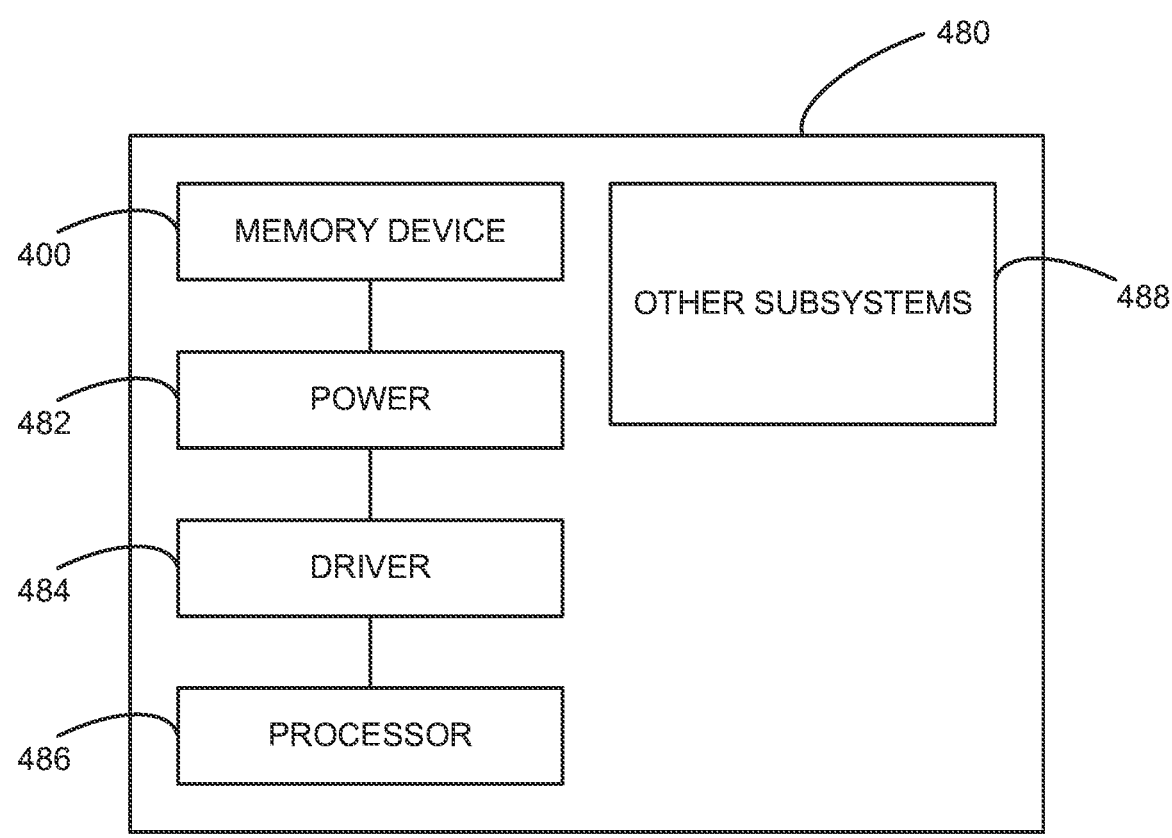
FIG. 4 is a schematic view of a system that includes a memory device in accordance with embodiments of the present technology.

FIG. 4 is a schematic view of a system that includes a memory device in accordance with embodiments of the present technology. Any one of the foregoing memory devices described above with reference to FIGS. 1-3 can be incorporated into any of a myriad of larger and/or more complex systems, a representative example of which is system 480 shown schematically in FIG. 4. The system 480 can include a memory device 400, a power source 482, a driver 484, a processor 486, and/or other subsystems or components 488. The memory device 400 can include features generally similar to those of the memory device described above with reference to FIGS. 1-3, and can therefore include various features for performing the operations discussed above. The resulting system 480 can perform any of a wide variety of functions, such as memory storage, data processing, and/or other suitable functions. Accordingly, representative systems 480 can include, without limitation, hand-held devices (e.g., mobile phones, tablets, digital readers, and digital audio players), computers, vehicles, appliances and other products. Components of the system 480 may be housed in a single unit or distributed over multiple, interconnected units (e.g., through a communications network). The components of the system 480 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. An apparatus, comprising:
a memory array including memory cells; and
a controller coupled to the memory array, the controller configured to:
identify valid data stored in one or more groupings of the memory cells;
designate a storage mode for a target set of memory cells based on the valid data,
wherein the target set of memory cells are configured with a capacity to store up to a maximum number of bits per cell, and
wherein the storage mode is for dynamically configuring the target set of memory cells in as cache memory that stores a number of bits less per cell than the corresponding maximum capacity.

2. The apparatus of claim 1, wherein the valid data is associated with a garbage collection (GC) process.

3. The apparatus of claim 2, wherein the controller is configured to designate single-level cell (SLC) mode for the storage mode when the valid data associated with the GC process is below a decision threshold.

4. The apparatus of claim 2 wherein the controller is configured to designate an extra-level cell (XLC) mode for the storage mode when the valid data is not less than a decision threshold.

5. The apparatus of claim 2, wherein:
the one or more groupings of the memory cells comprise a GC source block; and
the controller is further configured to:
calculate a valid data measure for the GC source block for representing an amount of the valid data within the GC source block; and
designate the target set of memory cells to operate in SLC mode based on comparing the valid data measure to a decision threshold.

6. The apparatus of claim 5, wherein the decision threshold corresponds to operating the target set of memory cells in the SLC mode when the valid data within the source block is less than 25% of a total capacity of the source block.

7. The apparatus of claim 1 wherein the target set of memory cells is indicated by a host cursor for the subsequent or upcoming data writes.

8. The apparatus of claim 1 wherein the target set of memory cells is indicated by a GC cursor for the subsequent or upcoming data writes.

9. The apparatus of claim 1 wherein the controller is further configured to:
according to the valid data, determine a low logic saturation state for the memory array; and
based on the low logic saturation state, designate SLC mode for the storage mode for upcoming data writes.

10. The apparatus of claim 1 wherein the controller is configured to designate the storage mode as SLC mode under steady-state.

11. The apparatus of claim 1 wherein the memory array includes static SLC blocks designated as static cache, wherein the static SLC blocks store one bit per cell and is separate from the target set of memory cells.

12. The apparatus of claim 1 wherein the controller is configured to designate the storage mode as SLC mode for the subsequent or upcoming data writes regardless of an amount of the data previously written in the SLC mode.

13. The apparatus of claim 1 wherein the controller is configured to designate the storage mode as SLC mode for the subsequent or upcoming data writes regardless of a data desirability measure associated with a performance model for characterizing the previously stored data.

14. A method of operating an apparatus that includes a controller and memory array having memory cells, the method comprising:
identifying valid data stored in one or more groupings of the memory cells; and
designating a storage mode for a target set of memory cells based on the valid data,
wherein the storage mode is for dynamically configuring the target set of memory cells as cache memory that stores a number of bits per cell less than the corresponding maximum storage capacity.

15. The method of claim 14, wherein the valid data is identified during a GC process.

16. The method of claim 14, wherein the target set of memory cells is indicated by a host cursor for a subsequent or upcoming data writes.

17. The method of claim 14, wherein the target set of memory cells is indicated by a GC cursor for a subsequent or upcoming data writes.

18. The method of claim 14, wherein designating the storage mode includes designating a SLC mode for the storage mode when the valid data is less than a decision threshold.

19. The method of claim 18, wherein designating the SLC mode includes designating the SLC mode regardless of an amount of the data previously written in the SLC mode, regardless of a data desirability measure associated with a performance model for characterizing the previously stored data, or a combination thereof.

20. A memory system, comprising:
a host device; and
a memory device coupled to the host device and configured to store data and provide access to the data for the host device, the memory device further configured to:
identify valid data stored in one or more groupings of the memory cells;
designate a storage mode for a target set of memory cells based on the valid data,
wherein the target set of memory cells are configured with a capacity to store up to a maximum number of bits per cell, and
wherein the storage mode is for dynamically configuring the target set of memory cells in as cache memory that stores a number of bits less per cell than the corresponding maximum capacity.

* * * * *